(12) United States Patent
Arai et al.

(10) Patent No.: US 8,183,606 B2
(45) Date of Patent: May 22, 2012

(54) SEMICONDUCTOR DEVICE AND METHOD OF MANUFACTURING THE SAME

(75) Inventors: Ryuta Arai, Hyogo-ken (JP); Hidetoshi Asahara, Hyogo-ken (JP); Kouji Murakami, Hyogo-ken (JP); Keiko Kawamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 12/626,414

(22) Filed: Nov. 25, 2009

(65) Prior Publication Data

US 2010/0127330 A1 May 27, 2010

(30) Foreign Application Priority Data

Nov. 27, 2008 (JP) ................................ 2008-302103
Jan. 23, 2009 (JP) ................................ 2009-013512

(51) Int. Cl.
*H01L 29/76* (2006.01)
(52) U.S. Cl. ........ 257/288; 257/262; 257/302; 257/331; 257/332; 257/334
(58) Field of Classification Search ........... 257/355–356
See application file for complete search history.

(56) References Cited

U.S. PATENT DOCUMENTS

| | | | | |
|---|---|---|---|---|
| 5,644,157 A * | 7/1997 | Iida et al. | | 257/510 |
| 5,989,975 A * | 11/1999 | Kuo | | 438/424 |
| 6,049,108 A * | 4/2000 | Williams et al. | | 257/341 |
| 6,265,744 B1 * | 7/2001 | Okumura | | 257/330 |
| 6,365,932 B1 * | 4/2002 | Kouno et al. | | 257/341 |
| 6,541,826 B2 * | 4/2003 | Iwagami et al. | | 257/379 |
| 6,635,537 B2 * | 10/2003 | Lee et al. | | 438/289 |
| 6,943,396 B2 * | 9/2005 | McNeil | | 257/302 |
| 7,585,705 B2 * | 9/2009 | Pan et al. | | 438/141 |
| 7,679,132 B2 * | 3/2010 | Yoshie | | 257/328 |
| 7,692,221 B2 * | 4/2010 | Ozeki et al. | | 257/262 |
| 7,692,240 B2 * | 4/2010 | Ishida et al. | | 257/339 |
| 7,728,385 B2 * | 6/2010 | Pan et al. | | 257/356 |
| 7,825,431 B2 * | 11/2010 | Bhalla et al. | | 257/173 |
| 7,868,363 B2 * | 1/2011 | Zundel et al. | | 257/288 |
| 7,897,997 B2 * | 3/2011 | Hsieh | | 257/139 |
| 2002/0036326 A1 * | 3/2002 | DeJong et al. | | 257/369 |
| 2002/0113274 A1 * | 8/2002 | Iwagami et al. | | 257/379 |
| 2002/0195657 A1 * | 12/2002 | Williams et al. | | 257/332 |
| 2005/0045945 A1 * | 3/2005 | Yoshikawa et al. | | 257/331 |

(Continued)

FOREIGN PATENT DOCUMENTS

JP 2003-69021 3/2003

(Continued)

*Primary Examiner* — Eugene Lee
*Assistant Examiner* — Mohammed Shamsuzzaman
(74) *Attorney, Agent, or Firm* — Patterson & Sheridan, LLP

(57) ABSTRACT

A semiconductor device comprises an insulated gate field effect transistor and a protection diode. The insulated gate field effect transistor has a gate electrode formed on a gate insulating film, a source and a drain. The source and the drain are formed in a first area of a semiconductor substrate. A first silicon oxide film is formed on a second area of the semiconductor substrate adjacent to the first area. The first silicon oxide film is thicker than the gate insulating film and contains larger amount of impurities than the gate insulating film. A poly-silicon layer is formed on the first silicon oxide film. The protection diode has a plurality of PN-junctions formed in the poly-silicon layer. The protection diode is connected between the gate electrode and the source so as to prevent breakdown of the gate insulating film.

5 Claims, 13 Drawing Sheets

U.S. PATENT DOCUMENTS

| | | | |
|---|---|---|---|
| 2007/0138546 A1* | 6/2007 | Kawamura et al. | 257/330 |
| 2007/0176239 A1* | 8/2007 | Hshieh | 257/355 |
| 2007/0194374 A1* | 8/2007 | Bhalla et al. | 257/330 |
| 2008/0224149 A1* | 9/2008 | Yoshie | 257/77 |
| 2008/0258224 A1* | 10/2008 | Hshieh | 257/356 |
| 2010/0052044 A1* | 3/2010 | Hirler | 257/328 |
| 2010/0327359 A1* | 12/2010 | Nakazawa et al. | 257/355 |

FOREIGN PATENT DOCUMENTS

JP  2003-264289  9/2003

* cited by examiner

SECOND EMBODIMENT $t3 < t1 < t2$

SECOND REFFERENCE

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2008-302103, filed on Nov. 27, 2008, and the prior Japanese Patent Application No. 2009-013512, filed on Jan. 23, 2009, the entire contents of which are incorporated herein by reference.

FIELD OF THE INVENTION

The invention relates to a semiconductor device and a method of manufacturing the same.

DESCRIPTION OF THE BACKGROUND

Heretofore, there has been a semiconductor device in which a poly-silicon diode serving as an electrostatic breakdown protection element is formed on a substrate where a MOS transistor is formed, in order to protect the MOS transistor from electrostatic discharge (ESD) caused by external static electricity. A semiconductor device of this kind is disclosed in Japanese Patent Application Publication No. 2003-69021.

In the semiconductor device, a gate insulating film having a thickness of 30 to 150 nm is formed on top of a drift region, and a thin field oxide film having the same thickness as that of the gate insulating film is formed on top of an electric field relaxation region. A poly-silicon diode is formed on the field oxide film.

Normally, a poly-silicon diode is formed at the same time when a MOS transistor is formed. In accordance with advancement in performance and miniaturization of MOS transistors, the gate insulating film becomes thinner, and thus a base oxide film of the poly-silicon diode becomes thinner at the same time.

Such a thin base oxide film, however, causes a problem that the poly-silicon diode has a rectification failure due to the influence of the electric potential of the base.

To cope with such a problem, there is a semiconductor device in which a poly-silicon diode is formed on an oxide film thicker than a gate oxide film. A semiconductor device of this kind is disclosed in Japanese Patent Application Publication No. 2003-264289.

In the semiconductor device, a thin oxide film having a thickness of approximately 30 nm is formed on an active region where a MOS transistor is to be formed. Moreover, a thick oxide film having a thickness of approximately 100 nm is formed on a field region where a poly-silicon diode is to be formed. These oxide films are formed by thermally oxidizing a surface of a semiconductor substrate, and further, selectively oxidizing the surface with a nitride film used as a mask.

Next, trenches are formed in the active region, and a gate oxide film is formed on an inner surface of each of the trenches. Thereby, the MOS transistor is formed.

However, the manufacturing of the semiconductor requires a long thermal treatment at a high temperature to form the thick oxide film as a base for the poly-silicon diode, so that the semiconductor substrate may possibly be deformed. Accordingly, there is a concern that such deformation may affect the reliability of the semiconductor device.

Moreover, the thick oxide film on the active region and the thin gate oxide film for the MOS transistor are separately formed. Thus, there is a problem that the number of manufacturing steps increases.

Furthermore, the flatness of the semiconductor substrate is reduced when the thick oxide film is formed on the active region. The reduced flatness brings about disadvantages such as reduction in a margin of focal depth in a subsequent lithography process, which in turn causes misalignment of mask, and reduction in coverage of a thin resist layer. Such disadvantages result in a problem of making miniaturization of the MOS transistor more difficult.

SUMMARY OF THE INVENTION

One aspect of the invention is to provide a semiconductor device including, an insulated gate field effect transistor having a gate electrode formed on a gate insulating film, a source and a drain, the source and the drain being formed in a first area of a semiconductor substrate, a first silicon oxide film formed on a second area of the semiconductor substrate adjacently to the first area, the first silicon oxide film being thicker than the gate insulating film and containing larger amount of impurities than the gate insulating film, a poly-silicon layer formed on the first silicon oxide film, and a protection diode having a plurality of PN-junctions formed in the poly-silicon layer, the protection diode being connected between the gate electrode and the source.

Another aspect of the invention is to provide a method of manufacturing a semiconductor device, including an insulated gate field effect transistor having a gate electrode formed on a gate insulating film, a source and a drain, the source and the drain being formed in a first area of a semiconductor substrate and a protection diode formed on a second area of the semiconductor substrate adjacent to the first area, comprising, forming a mask for covering the first area of the semiconductor substrate, forming a first ion-implanted layer by selectively implanting impurities into the second area of the semiconductor substrate, forming the gate insulating film on the first area and a first silicon oxide film on the second area by thermally oxidizing the surface of the first area and the first ion-implanted layer in the second area, forming a poly-silicon layer on the gate insulating film and the first silicon oxide film, forming the protection diode having a plurality of pn-junctions in the poly-silicon layer on the first silicon oxide film, and forming the gate electrode and a gate wiring to connect the gate electrode to an outside in the first area by selectively removing the poly-silicon layer using an anisotropic etching method.

BRIEF DESCRIPTION OF THE DRAWINGS

FIG. 1A is a plane view of the semiconductor device. FIG. 1B is an enlarged view showing a main portion.

FIG. 3A is a cross-sectional view taken along the line A-A of FIG. 1A, as viewed in a direction indicated by arrows. FIG. 3B is an enlarged view showing a main portion.

FIG. 4A is a diagram showing the embodiment. FIG. 4B is a diagram showing the first reference.

FIG. 8A is a plane view of the semiconductor device. FIG. 8B is an enlarged view showing a main portion.

FIG. 9A is a cross-sectional view taken along the line B-B of FIG. 8A, as viewed in a direction indicated by arrows. FIG. 9B is an enlarged view showing a main portion.

FIG. 13A is a diagram showing the main portion of the embodiment. FIG. 13B is a diagram showing a main portion of the second reference.

DETAILED DESCRIPTION OF THE INVENTION

Embodiments of the invention will be described hereinafter with reference to the drawings.

First Embodiment

Figure 1A:
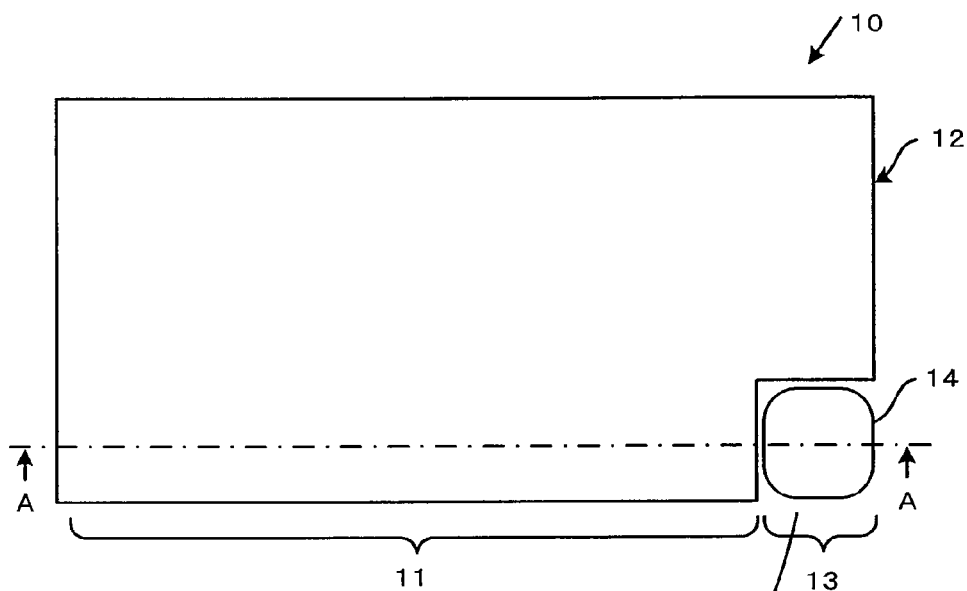
FIGS. 1A and 1B are diagrams showing a semiconductor device according to a first embodiment of the invention.
Figure 1B:
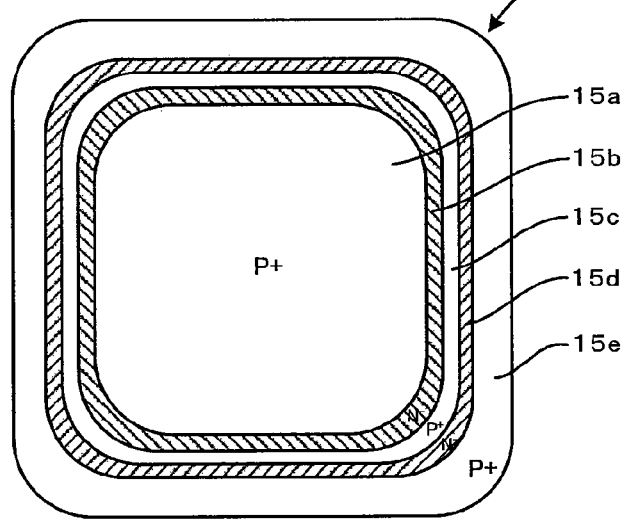
Figure 2:
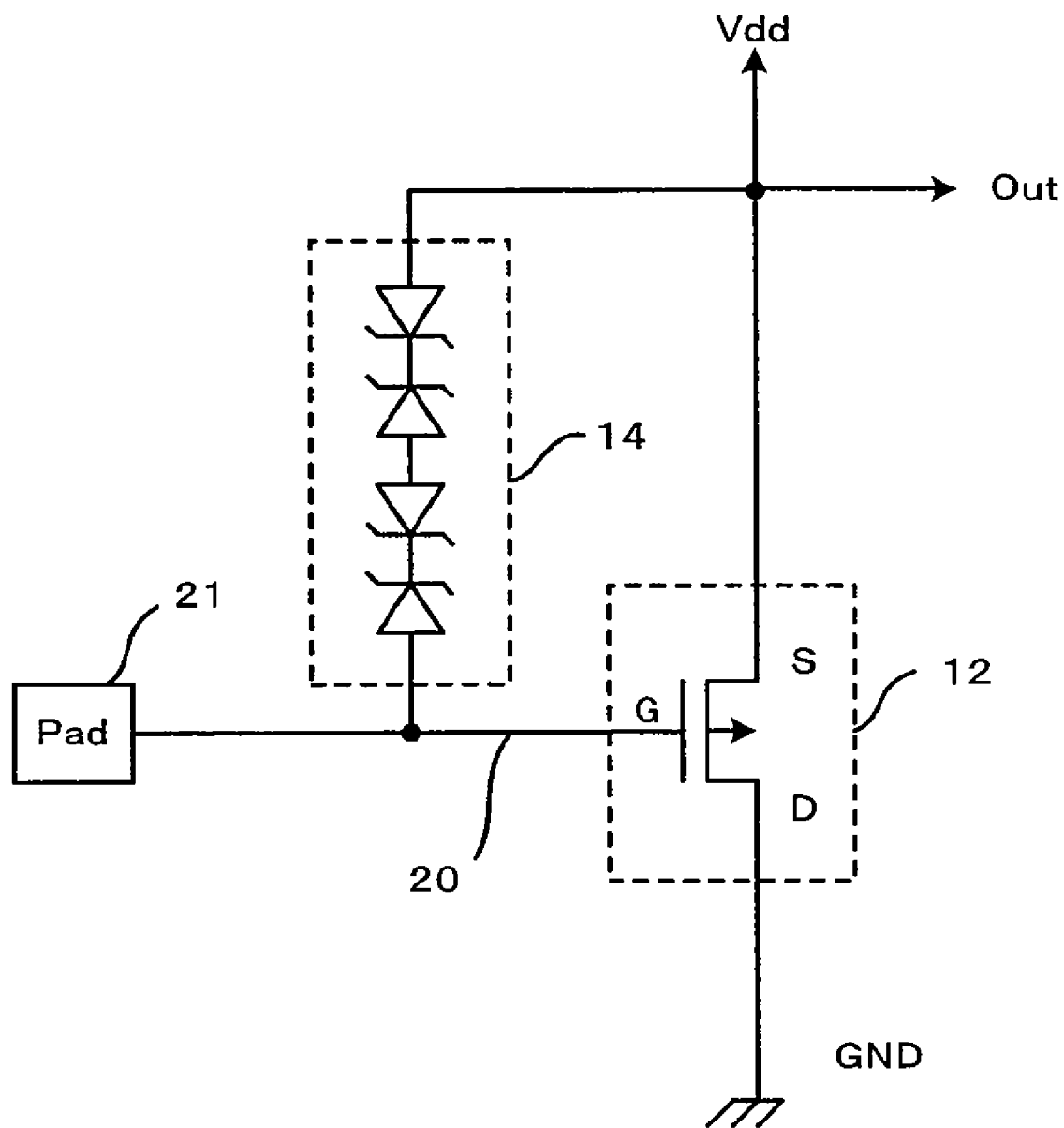
FIG. 2 is a circuit diagram showing an equivalent circuit of the semiconductor device according to the first embodiment of the invention.
Figure 3A:
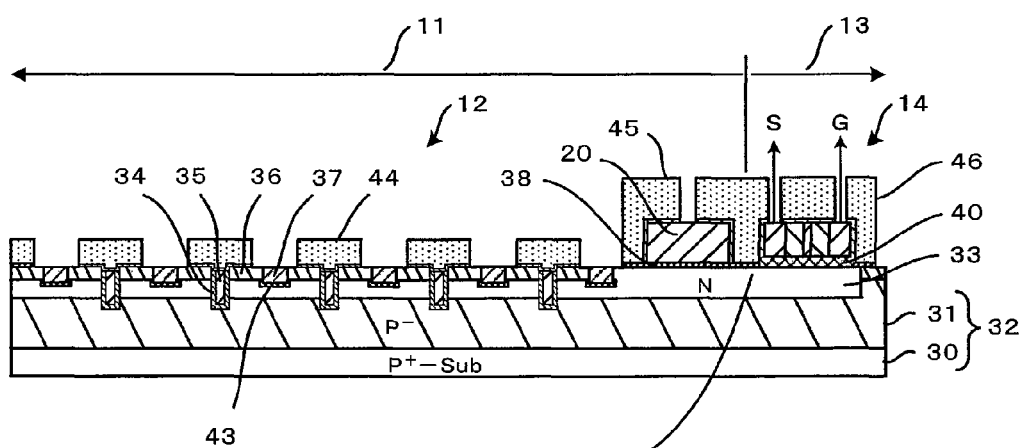
FIGS. 3A and 3B are diagrams showing the semiconductor device according the first embodiment of the invention.
Figure 3B:
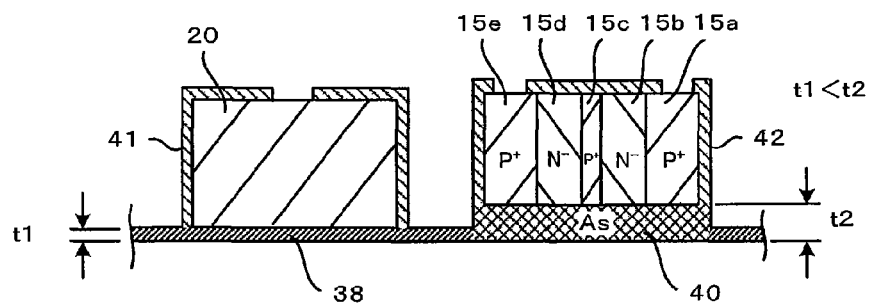
Figure 4A:
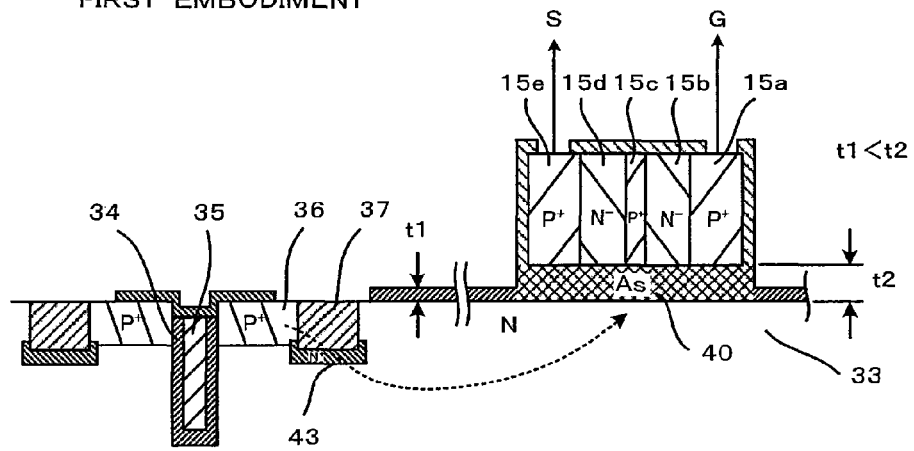
FIGS. 4A and 4B are diagrams to show effects of the semiconductor device according to the first embodiment of the invention in comparison with a first reference.
Figure 4B:
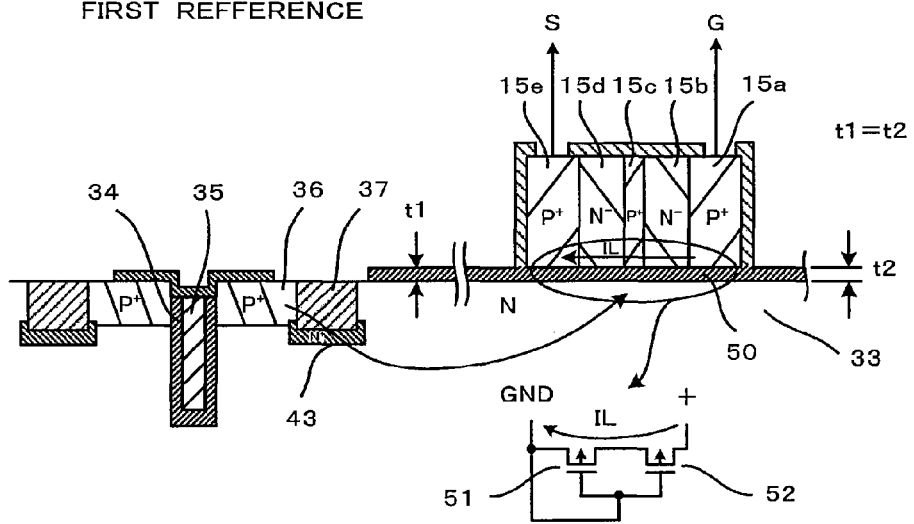

A semiconductor device according to a first embodiment of the invention will be described with reference to FIGS. 1A to 7C. FIGS. 1A and 1B are diagrams showing the semiconductor device. FIG. 1A is a plane view of the semiconductor device. FIG. 1B is an enlarged view showing a main portion. FIG. 2 is a diagram showing an equivalent circuit of the semiconductor device. FIGS. 3A and 3B are diagrams showing the semiconductor device. FIG. 3A is a cross-sectional view taken along the line A-A of FIG. 1A, as viewed from a direction indicated by arrows. FIG. 3B is an enlarged view showing a main portion. FIGS. 4A and 4B are diagrams to show effects of the semiconductor device in comparison with a first reference. FIG. 4A is a diagram showing the embodiment. FIG. 4B is a diagram showing the first reference. FIGS. 5A to 7C are cross sectional views sequentially showing manufacturing steps of the semiconductor device.

The embodiment is an example of a semiconductor device having an insulated gate field effect transistor (hereinafter, simply referred to as a MOS transistor) having trench gates, and a protection diode to prevent breakdown of a gate insulating film of the MOS transistor from being caused by polarity electrostatic discharge.

As shown in FIG. 1A, in a semiconductor device 10 of the embodiment, a MOS transistor 12 is formed in a first area 11 of a semiconductor substrate, and a protection diode 14 is formed in a second area 13 adjacent to the first area 11. The protection diode 14 has a plurality of PN-junctions in a poly-silicon layer formed on a not-shown silicon oxide film (first silicon oxide film), which is thicker than a gate insulating film of the MOS transistor 12, and which contains larger amount of impurities such as arsenic than the gate insulating film. The protection diode 14 is connected between a gate electrode and a source of the MOS transistor 12.

The first area 11 is a rectangular area from which one of the corners, for example, is notched out. The second area 13 is located in the notched corner.

The MOS transistor 12 is a vertical-type P-channel MOS transistor having trench gates (not shown) in a stripe shape, for example.

The protection diode 14 is a poly-silicon diode having a planar shape in which $P^+$ layers 15a, 15c, 15e and $N^-$ layers 15b, 15d are alternately bonded to one another in a ring-like shape.

The $N^-$ layer 15b surrounds the $P^+$ layer 15a, and the $P^+$ layer 15c surrounds the $N^-$ layer 15b. The $N^-$ layer 15d surrounds $P^+$ layer 15c, and the $P^+$ layer 15e surrounds the $N^-$ layer 15d.

As it is well known, the protection diode 14 having the ring-like PN-junctions does not have an edge portion of the PN-junctions, so that the protection diode 14 has an advantage that degradation of the properties such as reduction in the withstand voltage at an edge does not occur.

As shown in FIG. 2, in the MOS transistor 12, the gate is connected to an external input terminal 21 via a gate wiring 20, a power supply Vdd is supplied to the source, and the drain is connected to a reference potential GND.

The protection diode 14 has a $P^+/N^-/P^+/N^-/P^+$ structure and is a bi-directional protection diode in which four Zener diodes are equivalently and alternately connected in series (back-to-back connection) in reverse polarity. One end of the protection diode 14 is connected to the gate electrode of the MOS transistor 12 and the other is connected to the source.

As shown in FIG. 3A, in the semiconductor device 10, a semiconductor substrate 32 is formed of a $P^+$ silicon substrate 30 and a $P^-$ semiconductor layer 31 formed on the $P^+$ silicon substrate 30. An N base layer 33 is formed on the $P^-$ semiconductor layer 31 of the semiconductor substrate 32. The MOS transistor 12 is formed in the first area 11 of the semiconductor substrate 32. The protection diode 14 is formed in the second area 13 of the semiconductor substrate 32.

Here, only a left half of the ring-like $P^+/N^-/P^+/N^-/P^+$ structure of the protection diode 14 is shown.

In the first area 11 of the semiconductor substrate 32, a gate insulating film (gate oxide film) 34 is formed on an inner surface of each of not-shown trenches that penetrate through the N base layer 33 and then reach the $P^-$ semiconductor layer 31. Then, a gate electrode 35 is buried in the trench.

Sources 36 are formed in an upper portion of the N base layer 33 so as to sandwich adjacent one of the gate electrodes 35 in a gate length direction. Moreover, source contacts (metal) 37 are also formed so as to sandwich the sources 36 in the gate length direction.

The $P^-$ semiconductor layer 31 serves as a drift layer of the carriers, and the $P^+$ silicon substrate 30 serves as the drain.

An insulating film 38, which is the same as the gate insulating film 34, is formed on the N base layer 33 of the first area 11 on the second area 13 side. A gate wiring 20 whose one end is connected to the gate electrodes 35 and whose other end is connected to the external input terminal 21 is formed on the insulating film 38.

As shown in FIG. 3B, a silicon oxide film 40 (first silicon oxide film), which is thicker than the gate insulating film 34 and which contains larger amount of arsenic (As) than the gate insulating film 34, is formed in the second area 13 of the semiconductor substrate 32.

The P+ layers 15a, 15c, 15e and the N− layers 15b, 15d are formed on the silicon oxide film 40 while being alternately bonded to one another in the ring-like shape.

The gate insulating film 34 is formed to have a thickness t1 of approximately 30 nm, for example. The silicon oxide film 40 containing arsenic is formed to have a thickness t2 of approximately 100 nm, for example, which is at least three times greater than the thickness of the gate insulating film 34.

The silicon oxide film 40 having a large thickness is formed by using increased rate oxidation of silicon containing arsenic in high concentration, as it is well known. With the increased rate oxidation, in accordance with the amount of arsenic contained and the thermal oxidation conditions, a thermally oxidized film having a thickness approximately twice to ten times larger than that of silicon not containing As can be easily obtained.

Silicon oxide films 41, 42 are formed around the gate insulating layer 20 and the protection diode 14, respectively.

Moreover, an N+ type semiconductor layer 43 having a high carrier density is formed at the boundary surface between the N base layer 33 and each of the source contacts 37 in order to prevent avalanche breakdown.

Protection films 44 are formed on the gate electrodes 35, respectively. Protection films 45 and 46 are formed on the gate wiring 20 and the protection diode 14, respectively.

FIGS. 4A and 4B are diagrams to show effects of the semiconductor device 10 in comparison with the first reference. FIG. 4A is a diagram showing the embodiment. FIG. 4B is a diagram showing the first reference. Here, the first reference refers to a semiconductor device in which the protection diode 14 is formed on a silicon oxide film having a thickness equal to the thickness of the gate insulating film 34. Firstly, the first reference will be described.

As shown in FIG. 4B, in the first reference, the silicon oxide film 50 is approximately as thin as the gate insulating film 34. Accordingly, a series circuit of P-channel parasitic MOS transistors 51, 52 each including the silicon oxide film 50 as the gate insulating film is formed. Moreover, the series circuit of each of P-channel parasitic MOS transistors 51, 52 includes the N base layer 33 as the gate electrode, the P+ layers 15e, 15c, 15a as the source/drain, and the N− layers 15d, 15b as the base layers.

When the gate electrode 35 to which the P+ layer 15a is connected is forward biased, and the source 36 to which the P+ layer 15e is connected is reverse biased, that is, when the gate electrode 35 becomes a positive electric potential, and the source 36 becomes a ground potential GND, the conductivity types of the bottom portions of the N− layers 15d, 15b reverse from N type to P type because the potential of the N base layer 33, which becomes the gate electrode, is connected to the potential of the source 36 via the source contact 37 and the N+ type semiconductor layer 43. Then, the two P-channel parasitic MOS transistors 51, 52 are turned on.

Accordingly, a leak current IL flows between the P+ layers 15a, 15e of the protection diode 14, so that the function of the protection diode 14 is damaged, and the reliability of the protection diode 14 may be thus degraded.

On the other hand, as shown in FIG. 4A, in the embodiment, the silicon oxide film 40 is at least three times thicker than the gate insulating film 34. Thus, the protection diode 14 is completely insulated from the N base layer 33, which is the base layer, so that the conductivity types of the bottom portions of the N− layers 15d, 15b do not reverse from N type to P type. Thus, the function of the protection diode 14 can be maintained, and a high reliability of the protection diode 14 can be obtained.

Next, a method of manufacturing the semiconductor device 10 will be described. FIGS. 5A to 7C are cross-sectional views sequentially showing manufacturing steps of the semiconductor device 10.

Figure 5A:
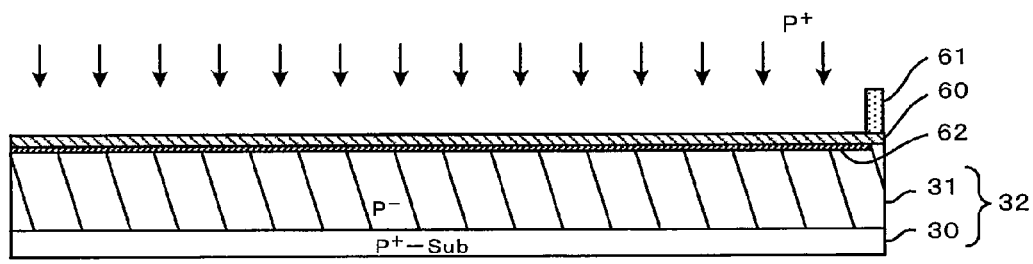
FIGS. 5A, 5B and 5C are cross sectional views sequentially showing manufacturing steps of the semiconductor device according to the first embodiment of the invention.

As shown in FIG. 5A, a silicon oxide film 60 having a thickness of approximately 200 nm is formed by thermal oxidation, for example, on the semiconductor substrate 32 having the P+ silicon substrate 30 and the P− semiconductor layer 31 formed on the P+ silicon substrate 30 by epitaxial growth.

Next, a resist film 61 having an opening corresponding to the N base layer 33 is formed on the silicon oxide film 60. Then, using the resist film 61 as a mask, phosphor (P) is ion-implanted into the P− semiconductor layer 31 of the semiconductor substrate 32 through the silicon oxide film 60. Thereby, a P ion-implanted layer 62 is formed.

Figure 5B:
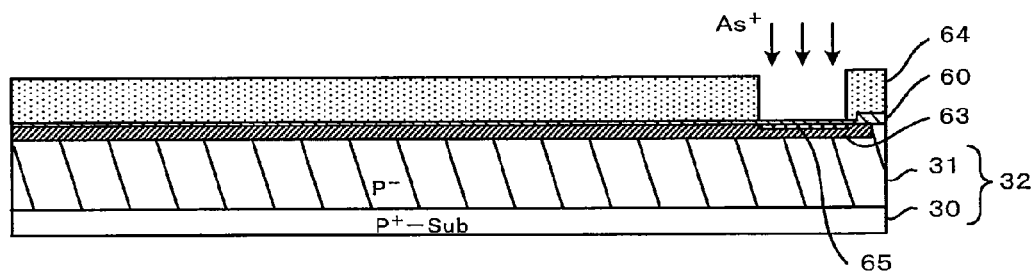

Next, as shown in FIG. 5B, after the resist layer 61 is removed, thermal treatment is performed, and the ion-implanted P is thereby activated. Thereby, an N-type semiconductor layer 63 is formed.

Next, a resist film 64 having an opening corresponding to the second area 13 is formed on the silicon oxide film 60. Then, a large amount (dose amount of 1E15 atoms/cm$^2$) of As is selectively ion-implanted into the second area 13 through the silicon oxide film 60 by using the resist film 64 as a mask. Thereby, an As ion-implanted layer (first ion-implanted layer) 65 is formed.

Figure 5C:
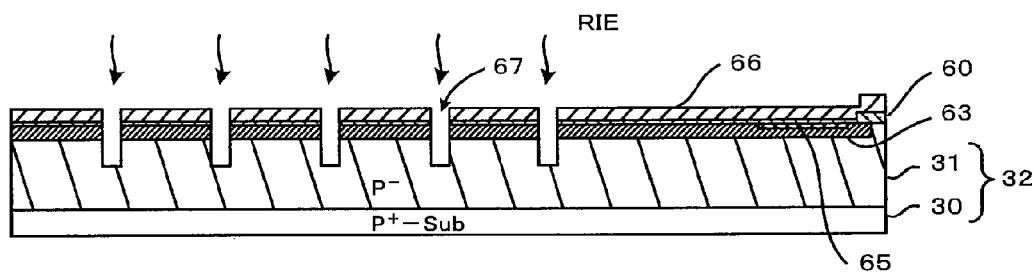

Next, as shown in FIG. 5C, after the resist layer 64 is removed, a mask member 66, for example, a silicon nitride film, having openings corresponding to the trenches is formed on the silicon oxide film 60. Then, trenches 67 each having a predetermined depth are formed in the P− semiconductor layer 31 in the first area 11 by an anisotropic etching method using the mask member 66.

At this stage, since the flatness of the surface of the semiconductor substrate 32 is maintained, a minute trench pattern can be formed by a photolithography method.

Figure 6A:
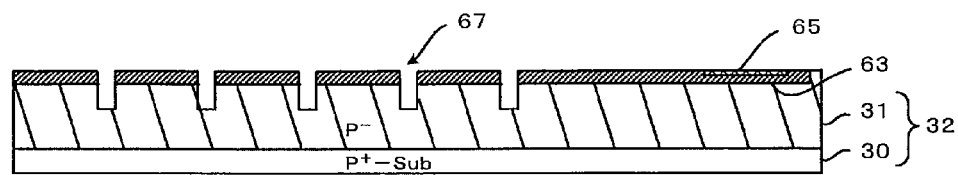
FIGS. 6A, 6B and 6C are cross sectional views sequentially showing manufacturing steps of the semiconductor device according to the first embodiment of the invention.

Next, as shown in FIG. 6A, the surface of the semiconductor substrate 32 is exposed by removing the mask member 66 and the silicon oxide film 60.

Figure 6B:
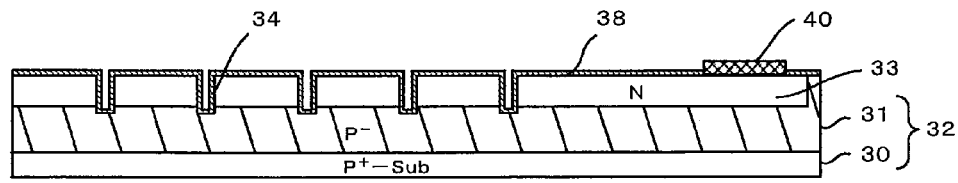

Next, as shown in FIG. 6B, the first area 11 and the second area 13 are subjected to thermal treatment in dry atmosphere at a temperature of 1000° C., for example.

Accordingly, P in the N-type semiconductor layer 63 in the first area 11 and the second area 13 is thermally diffused, and the N-type base layer 33 is thus formed.

Further, the first area 11 is thermally oxidized, and the gate insulating film 34 having a thickness of approximately 30 nm is formed on an inner surface of each of the trenches 67 in the first area 11. Then, the insulating film 38 having the same thickness as that of the gate insulating film 34 is formed on the surface of the N base layer 33.

Meanwhile, the second area 13 containing a large amount of As is oxidized at an increased rate, and then, the silicon film 40, which is thicker than the gate insulating film 34 and which contains larger amount of As than the gate insulating film 34, is formed with a thickness of approximately 100 nm in the second area 13.

Figure 6C:
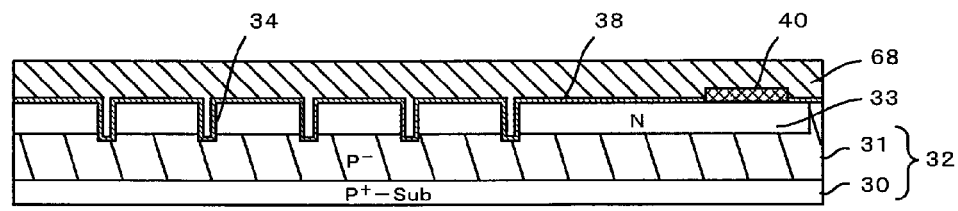

Next, as shown in FIG. 6C, an undoped poly-silicon layer 68 having a thickness of approximately 800 nm is formed by a CVD method, for example, on the entire surfaces of the first area 11 and the second area 13 in a way to bury the poly-silicon layer 68 in the trenches 67.

Figure 7A:
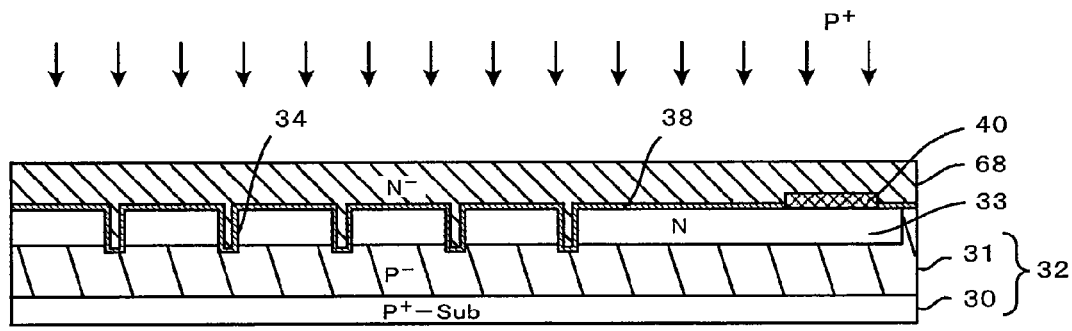
FIGS. 7A, 7B and 7C are cross sectional views sequentially showing manufacturing steps of the semiconductor device according to the first embodiment of the invention.

Next, as shown in FIG. 7A, the entire surface of the poly-silicon layer 68 is ion-implanted (dose amount of 1E15 atoms/cm$^2$) with P, and the conductivity type of the poly-silicon layer 68 is set to N-type.

Figure 7B:
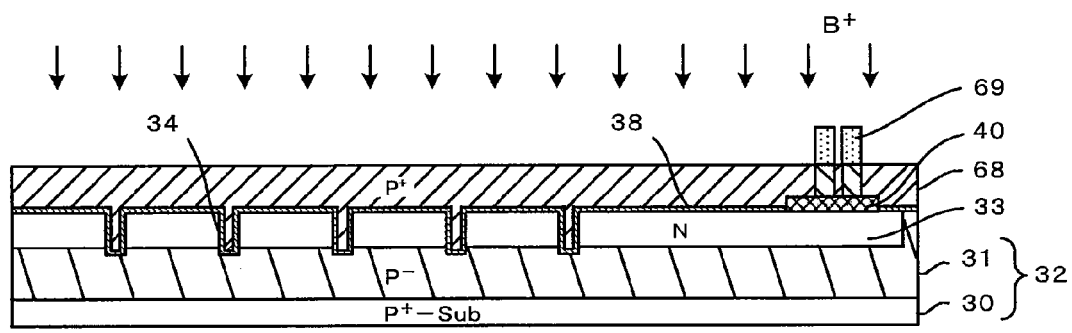

Next, as shown in FIG. 7B, a double ring-like resist film 69 is formed on the poly-silicon layer 68 in the second area 13. Then, using the resist film 69 as a mask, boron (B) is ion-implanted (dose amount of 1E15 atoms/cm$^2$) into the poly-silicon layer 68 in the first area 11 and the second area 13. The conductivity type of the poly-silicon layer 68 is thereby reversed from N$^-$ type to P$^+$ type, and a plurality of PN-junctions are formed in the poly-silicon layer 68 in the second area 13.

Figure 7C:
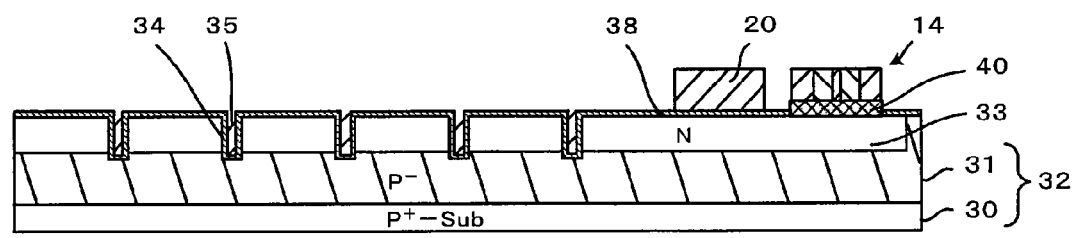

Next, as shown in FIG. 7C, the gate electrode 35 and the gate wiring 20 to electrically connect the gate electrodes 35 to an outside are formed in the first area 11 by selectively removing the poly-silicon layer 68 by an anisotropic etching method. At the same time, the protection diode 14 having a planar shape in which the P$^+$ layers and N$^-$ layers are alternately bonded in a ring-like shape is formed in the second area 13.

Next, the sources 36 and source contacts 37 are formed so as to sandwich adjacent one of the gate electrodes 35. Then, a drain electrode (not shown) is formed on the rear surface of the P$^+$ silicon substrate 30. Thereby, the semiconductor device 10 is obtained.

As described above, in the embodiment, As is selectively ion-implanted into the second area 13. Then, due to action of the increased rate oxidation of the silicon containing a large amount of As, the silicon oxide film 40, which is thicker than the gate insulating film 34 and which contains larger amount of As than the gate insulating film 34, is formed. The protection diode 14 is then formed on the silicon oxide film 40.

As a result, the thickness of the silicon oxide film 40 can be kept to at least 100 nm, even if the gate insulating film is formed thinner to have a thickness of 30 nm or less, for example, in accordance with miniaturization of the MOS transistor for the purpose of improving the performance of the MOS transistor.

Thereby, when the gate electrodes 35 are forward biased and the sources 36 are reverse biased, the parasitic MOS transistors 51, 52 are not turned on. Thus, the function of the protection diode 14 can be prevented from being damaged.

Accordingly, the semiconductor device which has a high reliability and which includes a protection diode whose configuration is preferable for miniaturization and a method of manufacturing the semiconductor device can be obtained.

In addition, the trenches 67 are formed before the protection diode 14 is formed on the silicon oxide film 40. Thus, minute trenches can be easily formed without being affected by reduction in the flatness of the semiconductor substrate 32 due to the protection diode 14.

Moreover, the gate wiring 20 can be formed simultaneously with the protection diode 14, so that manufacturing steps can be reduced.

Moreover, long thermal oxidation at a high temperature to form the thick silicon oxide film 40 is not necessary, so that there is no concern that impurities leaking out from the semiconductor substrate 32 side degrade the properties of the semiconductor device. Examples of such property degradation include reduction in the withstand voltage between the drain and source of the MOS transistor 12, and the like.

Here, the description has been given of the case where the MOS transistor 12 of the semiconductor device 10 is a P-MOS transistor. However, the same description applies to a case where the MOS transistor 12 is an N-MOS transistor.

Also, the description has been given of the case where the MOS transistor 12 is a vertical type MOS transistor having trench gates. However, the MOS transistor 12 can be a lateral type MOS transistor. The gate electrodes can be not only of a trench type but also a planar type.

Furthermore, the description has been given of the case where the protection diode 14 is a diode formed of four Zener diodes connected to each other in reverse polarity. However, the number of Zener diodes to be connected to each other is not limited in particular. The number can be even or odd. In accordance with the number of Zener diodes, the gate withstand voltage between the gate electrode 35 and the source 36 increases.

The description has been given of the case where the protection diode 14 has the P$^+$/N$^-$/P$^+$/N$^-$/P$^+$ structure. However, the protection diode 14 can have an N$^+$/P$^-$/N$^+$/P$^-$/N$^+$ structure. The same effects can be obtained in either of the structures.

Moreover, the description has been given of the case where the poly-silicon layer 68 is formed of undoped poly-silicon. However, the poly-silicon layer 68 can be formed of doped poly-silicon obtained by adding N-type impurities such as P in the poly-silicon. In that case, there is an advantage that the manufacturing step in which the conductivity type of the poly-silicon layer 68 is set to N-type by ion-implanting P into the poly-silicon layer 68 can be eliminated.

Moreover, the description has been given of the case where the impurities to be selectively implanted into the second area 13 are As. However, the same effects can be obtained even when P or B is used instead.

Second Embodiment

Figure 8A:
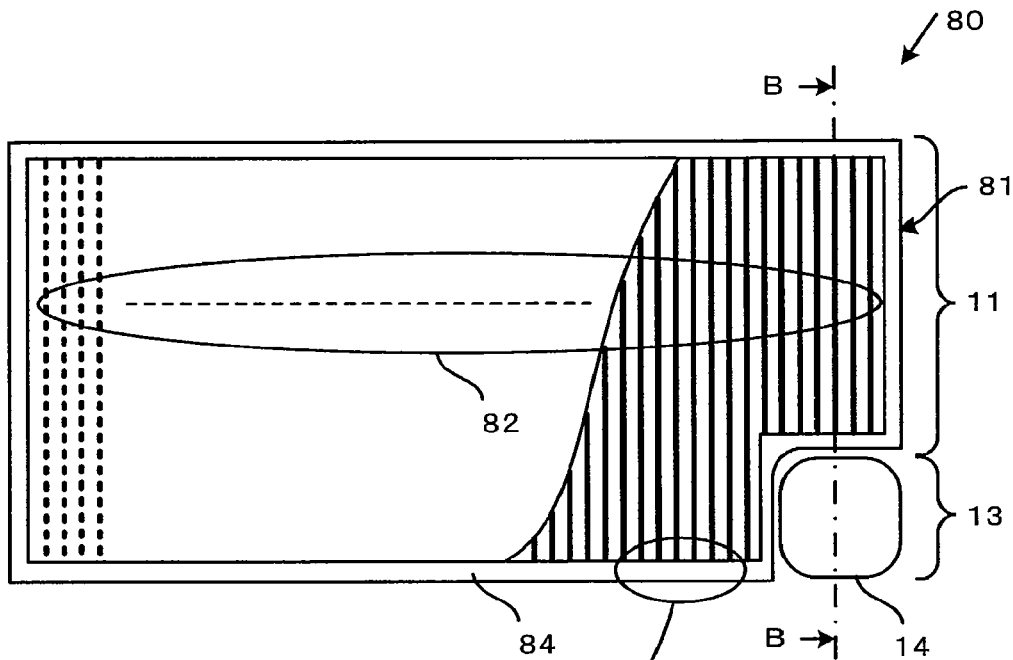
FIGS. 8A and 8B are diagrams showing a semiconductor device according to a second embodiment of the invention.
Figure 8B:
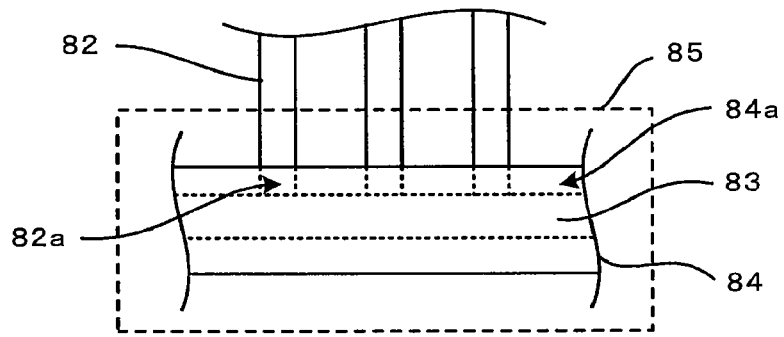
Figure 9A:
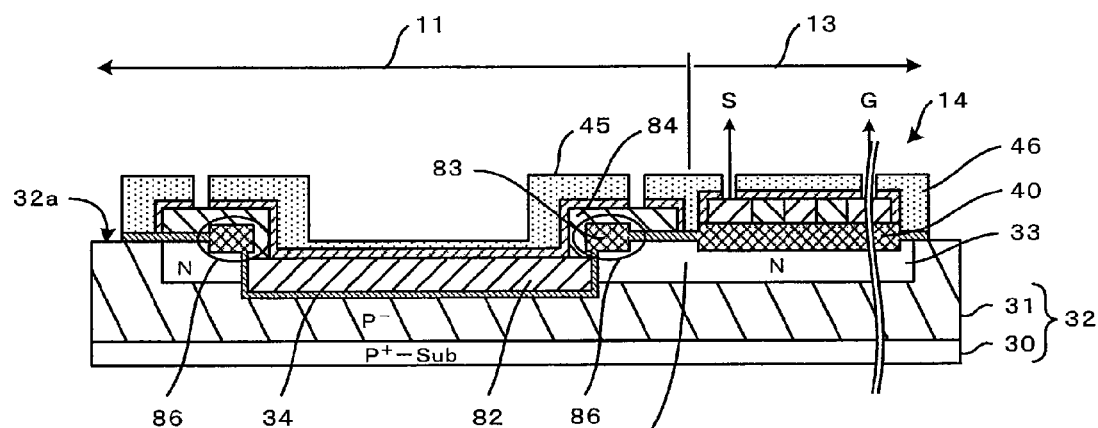
FIGS. 9A and 9B are diagrams showing the semiconductor device according the second embodiment of the invention.
Figure 9B:
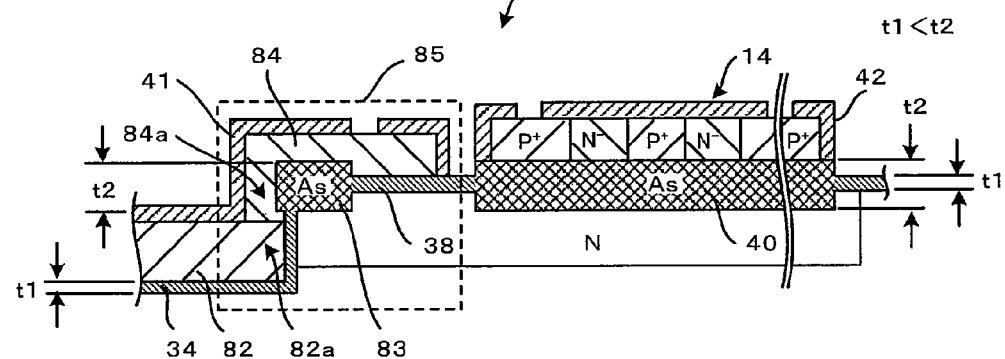

A semiconductor device according to a second embodiment of the invention will be described with reference to FIGS. 8A to 12C. FIGS. 8A and 8B are diagrams showing the semiconductor device. FIG. 8A is a plane view of the semiconductor device. FIG. 8B is an enlarged view showing a main portion. FIGS. 9A and 9B are diagrams showing the semiconductor device. FIG. 9A is a cross-sectional view taken along the line B-B of FIG. 8A, as viewed in a direction indicated by arrows. FIG. 9B is an enlarged view showing a main portion. FIGS. 10A to 12C are diagrams sequentially showing main portions of manufacturing steps of the semiconductor device. FIGS. 13A and 13B are diagrams to show the main portion of the semiconductor device in comparison with a second reference. FIG. 13A is a diagram showing the main portion of the embodiment, and FIG. 13B is a diagram showing a main portion of the second reference.

In the embodiment, the same constituent elements as those in the aforementioned first embodiment are denoted by the same reference numerals. The description of the same constituent elements is omitted, and only different elements will be described.

The embodiment is different from the first embodiment in that a gate electrode extraction portion of the MOS transistor is formed on a silicon oxide film which is thicker than the gate insulating film and which contains larger amount of As than the gate insulating film.

Specifically, as shown in FIG. 8A, a MOS transistor 81 of a semiconductor device 80 of the embodiment includes gate electrodes 82 in a stripe shape, a second silicon oxide film 83 and a gate wiring 84. The second silicon oxide film 83 is thicker than the gate insulating film and contains larger amount of As than the gate insulating film. The gate wiring 84 is formed so as to cover the second silicon oxide film 83.

Ends 82a of each of the gate electrodes 82 and a side portion 84a of the gate wiring 84 are overlapped and in contact with each other, thereby forming a gate electrode extraction portion 85. The gate wiring 84 is formed so as to surround the plurality of gate electrodes 82, and both of the ends of the gate electrodes 82 are overlapped and in contact with the gate wiring 84.

Specifically, as shown in FIGS. 9A and 9B, each gate electrode 82 is formed by burying the poly-silicon layer 68 in a corresponding one of the trenches 67 (not shown) via the gate insulating film 34. Each trench 67 is formed in a main surface 32a of the semiconductor substrate 32 in the first area 11.

The second silicon oxide film 83 is formed at each corner 86 formed of the main surface 32a of the semiconductor substrate 32 and a side surface of a corresponding one of the ends of the trench 67. The second silicon oxide film 83 contains a large amount of As as in the case of the silicon oxide film 40 and has the same thickness t2.

The gate wiring 84 has the poly-silicon layer 68 formed at the corner 86 so as to cover the second silicon oxide film 83. The upper surface of the end 82a of the gate electrode 82 and the bottom surface of the side portion 84a of the gate wiring 84 are overlapped and in contact with each other.

Next, a method of manufacturing the semiconductor device 80 will be described. FIGS. 10A to 11C are cross-sectional views sequentially showing main portions of manufacturing steps of the semiconductor device 80.

Figure 10A:
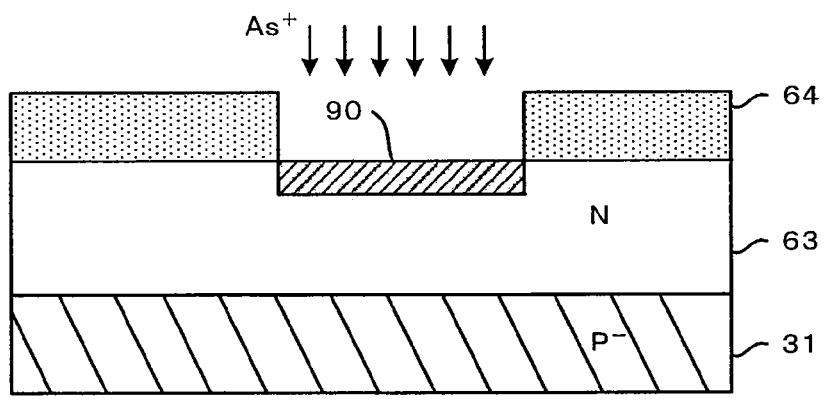
FIGS. 10A, 10B and 10C are cross-sectional views sequentially showing a main portion of manufacturing steps of the semiconductor device according to the second embodiment of the invention.

As shown in FIG. 10A, in the step of ion-implanting impurities shown in FIG. 5B, an As ion implanted layer 90 is formed simultaneously with the As ion-implanted layer 65 in the second area 13 by selectively ion-implanting a large amount (dose amount of 1E15 atoms/cm$^2$) of As through the silicon oxide film 60 (not shown) that coats the first area 11, while using, as the mask, a resist film 64 (coating member) having openings, the resist film 64 formed on the silicon oxide film 60.

Figure 10B:
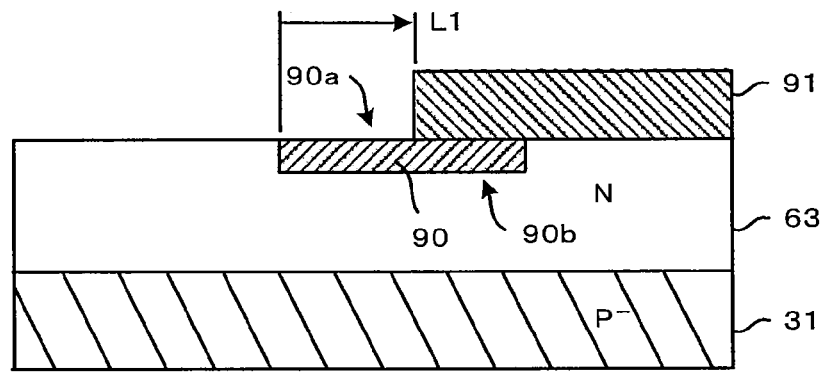

Next, as shown in FIG. 10B, after the resist film 64 is removed, in the step of forming the trenches shown in FIG. 5C, formation of a mask member 91 having openings corresponding to the trenches 67, that is, formation of an undoped silicon oxide film herein is performed so that a portion 90a of the As ion-implanted layer 90 (from the end to the length L1) would be removed and a side surface of each end of the trench 67 would be formed of a remaining portion 90b of the As ion-implanted layer 90.

Figure 10C:
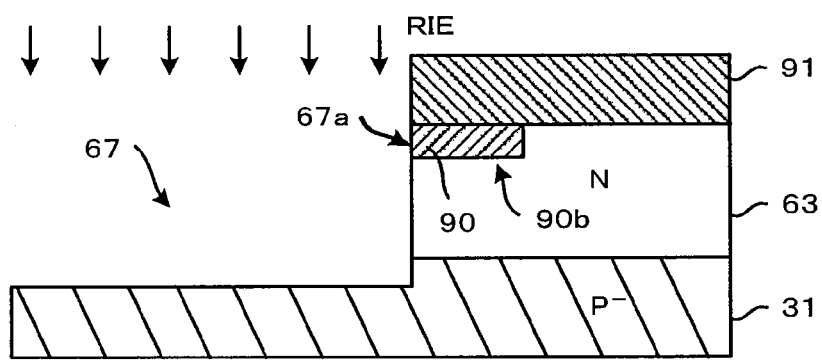

Next, as shown in FIG. 10C, the trench 67 having a predetermined depth reaching the P$^-$ semiconductor layer 31 in the first area 11 is formed by an anisotropic etching method using the mask member 91. Thereby, a portion 90a of the As ion-implanted layer 90 is removed and the portion 90b of the As ion-implanted layer 90 forms the side surface of the end 67a of the trench 67.

Figure 11A:
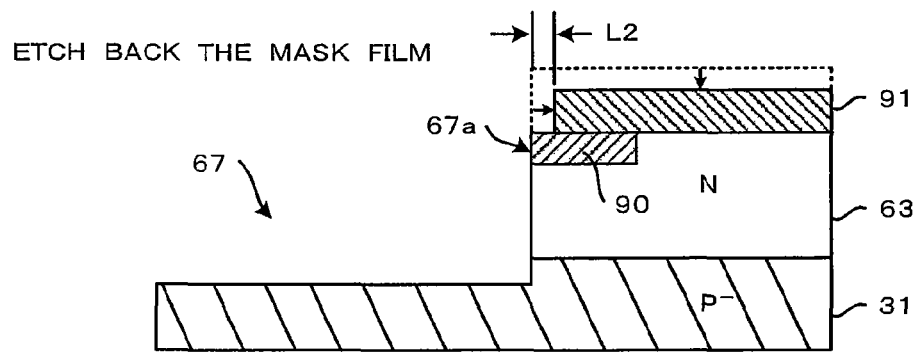
FIGS. 11A, 11B and 11C are cross-sectional views sequentially showing the main portion of manufacturing steps of the semiconductor device according to the second embodiment of the invention.

Next, as shown in FIG. 11A, the mask member 91 is partially etched away by use of buffered hydrofluoric acid (BHF) obtained by mixing hydrofluoric acid (HF) and ammonium fluoride (NH$_4$F). By the etching, the mask member 91 is caused to recede from the end 67a of the trench 67 by a length L2 while the thickness of the mask member 91 is reduced.

Figure 11B:
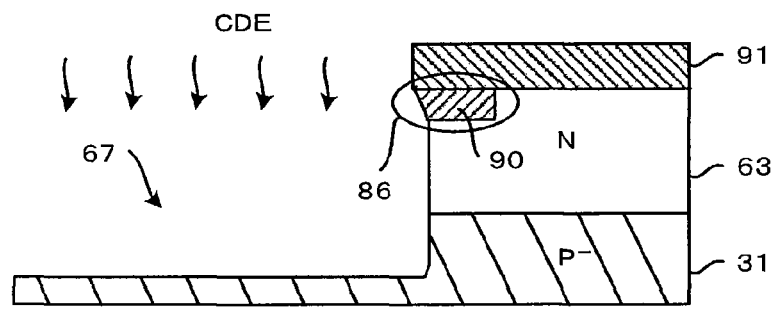

Next, as shown in FIG. 11b, an inner surface of the trench 67 is subjected to isotropic etching using a chemical dry etching (CDE) method using chlorine-based/fluorine based gas with the mask member 91 as a mask. In other words, the inner surface of the trench 67 is subjected to a so called etch back processing. Thereby, damage on the inner surface of the trench 67 is removed, and roughness on the inner surface is improved.

Here, the etching rate of the silicon becomes slow at the end 67a of the trench 67, which is immediately beneath of the mask member 91, so that the corner 86 has a sharp angle.

Figure 11C:
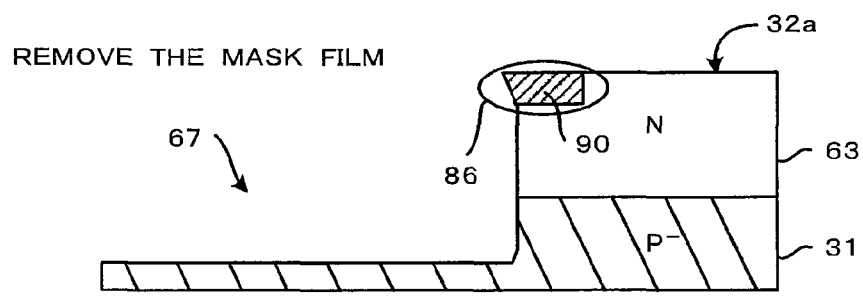

Next, as shown in FIG. 11C, in the step of FIG. 6A, the mask member 91 and the silicon oxide film 60 are removed to expose the main surface 32a of the semiconductor 32.

Figure 12A:
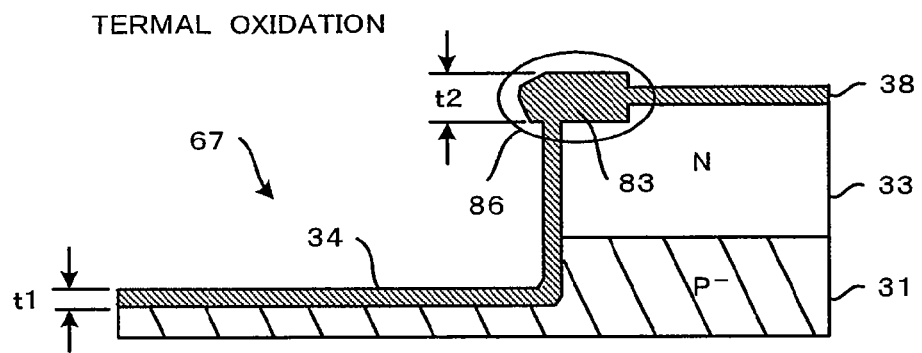
FIGS. 12A, 12B and 12C are cross-sectional views sequentially showing the main portion of manufacturing steps of the semiconductor device according to the second embodiment of the invention.
Figure 13A:
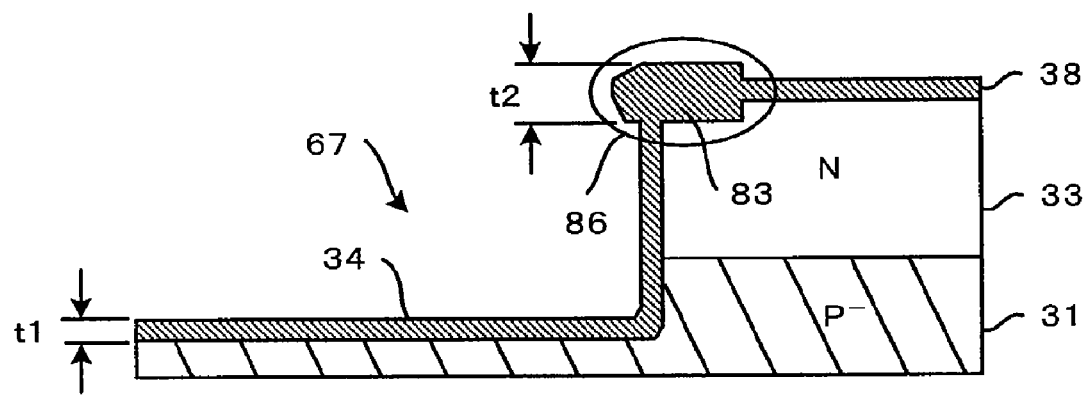
FIGS. 13A and 13B are diagrams to show the main portion of the semiconductor device according to the second embodiment of the invention in comparison with a second reference.
Figure 13B:
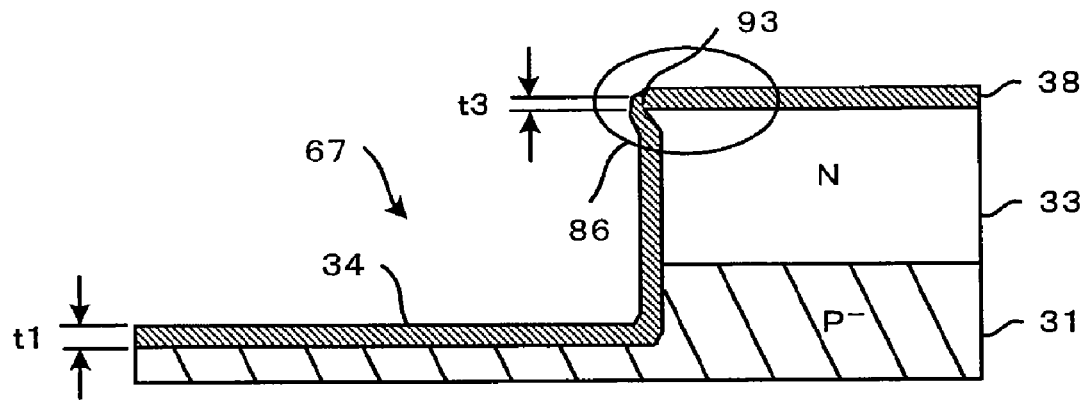

Next, as shown in FIG. 12A, in the step of subjecting the semiconductor substrate 32 to thermal treatment shown in FIG. 6B, the As ion-implanted layer 90 containing the large amount of As is oxidized at an increased rate, so that the second silicon oxide film 83, which is thicker than the gate insulating film 34 and which contains larger amount of As than the gate insulating film 34, is formed at the corner 86 simultaneously with the silicon oxide film 40.

Figure 12B:
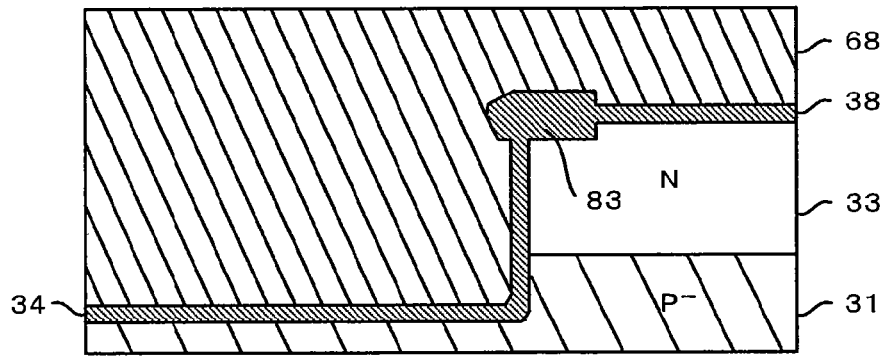

Next, as shown in FIG. 12B, in the step of forming the poly-silicon layer 68 shown in FIG. 6C, the poly-silicon layer 68 is formed by burying poly-silicon in the trench 67 so as to cover the second silicon oxide film 83.

Figure 12C:
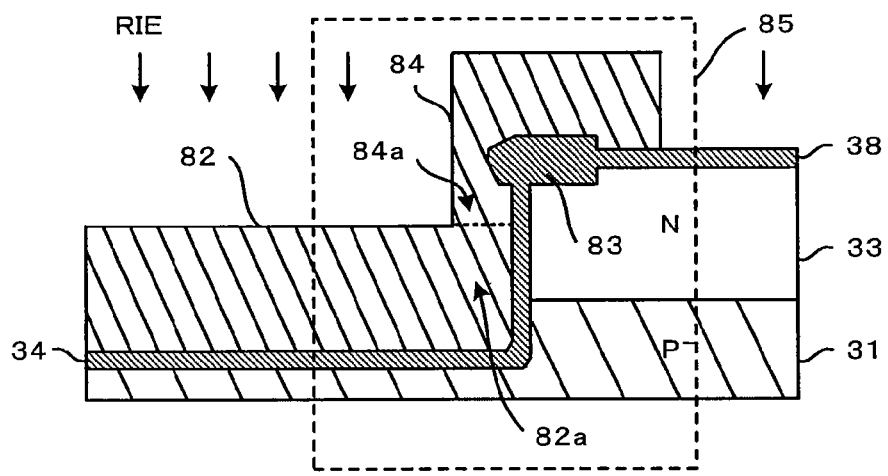

Next, as shown in FIG. 12C, in the step of selectively removing the poly-silicon shown in FIG. 7C, the gate electrode 82 obtained by burying the poly-silicon layer 68 as the gate electrode in the trench 67 via the gate insulating film 34 is formed. Then, the gate wiring 84 whose bottom surface is overlapped and in contact with the upper surface of the end 82a of the gate electrode 82 is formed. Thereby, the aforementioned gate electrode extraction portion 85 is obtained.

FIGS. 13A and 13B are diagrams to show the main portion of the semiconductor device 80 in comparison with the second reference. FIG. 13A is a diagram showing the main portion of the embodiment. FIG. 13B is a diagram showing a main portion of the second reference. Here, the second reference refers to a semiconductor device fabricated without forming the As ion-implanted layer 90. To begin with, the second reference will be described.

In the second reference, after the trench 67 shown in FIG. 11C is formed without forming the As ion-implanted layer 90 shown in FIG. 10A, the semiconductor substrate 32 is subjected to thermal treatment.

As a result, as shown in FIG. 13B, since the amount of silicon subjected to oxidation at the corner 86 having a sharp angle is small, a film thickness t3 of a silicon oxide film 93 to be formed is thinner than the film thickness t1 of the gate insulating film 34.

Here, in addition to the fact that mechanical and/or thermal stress concentration and concentration of electric fields are likely to occur at the corner 86 having the sharp angle, the silicon oxide film 93 of the corner 86 is thinner than the gate insulating film 34, so that there arises a problem that the breakdown resistance is reduced.

On the other hand, in the embodiment shown in FIG. 13A, as described above, the semiconductor substrate 32 is subjected to thermal treatment after the As ion-implanted layer 90 containing the large amount of As is formed at the corner 86 and the trench 67 is formed.

As a result, the As ion-implanted layer 90 is oxidized at an increased rate, so that the film thickness of the second silicon oxide film 83 formed at the corner 86 having the sharp angle becomes the film thickness t2, which is larger than the film thickness t1 of the gate insulating film 34.

Thereby, even when mechanical and/or thermal stress concentration and concentration of electric fields occur at the corner 86, the breakdown resistance can be improved since the silicon oxide film 83 at the corner 86 is thicker than the gate insulating film 34.

As described above, in the embodiment, the corner 86 formed of the main surface 32a of the semiconductor substrate 32 and the side surface of the end 67a of the trench 67 is selectively ion-implanted with As. Thereby, due to the action of increased rate oxidation of the silicon containing the large amount of As, the second silicon oxide film 83, which is thicker than the gate insulating film 34 and which contains larger amount of As than the gate insulating film 34 is formed. Then, the gate wiring 84 is formed at the corner 86 so as to cover the second silicon oxide film 83.

As a result, the thickness of the second silicon oxide film 83 can be kept to at least 100 nm, even if the gate insulating film 34 is formed thinner to have a thickness of 30 nm or less, for example, in accordance with miniaturization of the MOS transistor for the purpose of improving the performance of the MOS transistor. Accordingly, there is an advantage that the breakdown resistance of the silicon oxide film at the corner 86 can be improved.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising: an insulated gate field effect transistor having a gate electrode, a source and a drain, the gate electrode having a poly-silicon layer buried in a trench formed in a first area of a semiconductor substrate via the a gate insulating film, the source and the drain being formed in the first area of the semiconductor substrate;

a first silicon oxide film formed on a second area of the semiconductor substrate adjacent to the first area, the first silicon oxide film being thicker than the gate insulating film and containing larger amount of impurities than the gate insulating film;

a poly-silicon layer formed on the first silicon oxide film;

a protection diode having a plurality of PN-junctions formed in the poly-silicon layer, the protection diode being connected between the gate electrode and the source;

a second silicon oxide film formed at a corner formed of a main surface of the semiconductor substrate and a side surface of an end of the trench, the second silicon oxide film being thicker than the gate insulating film, containing larger amount of impurities than the gate insulating film and being in contact with the gate insulating film; and a gate wiring in contact with the end of the gate electrode, the gate wiring having a poly-silicon layer formed at the corner, so as to cover the second silicon oxide film.

2. The semiconductor device according to claim 1, wherein the poly-silicon layer formed at the corner is the same as the poly-silicon layer formed on the first silicon oxide film.

3. The semiconductor device according to claim 1, wherein the thickness of the second silicon oxide film is the same as the thickness of the first silicon oxide film.

4. The semiconductor device according to claim 1, wherein a dose amount of impurities into the second silicon oxide film is the same as the dose amount of impurities into the first silicon oxide film.

5. The semiconductor device according to claim 1, wherein the insulated gate field effect transistor has a plurality of gate electrodes, and the gate wiring surrounds the plurality of gate electrodes, each end of which is in contact with the gate wiring.

* * * * *